United States Patent
Smolka

(10) Patent No.: US 8,151,132 B2
(45) Date of Patent: Apr. 3, 2012

(54) MEMORY REGISTER HAVING AN INTEGRATED DELAY-LOCKED LOOP

(75) Inventor: John Smolka, San Jose, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 765 days.

(21) Appl. No.: 12/191,222

(22) Filed: Aug. 13, 2008

(65) Prior Publication Data

US 2010/0042863 A1 Feb. 18, 2010

(51) Int. Cl.
*G06F 1/12* (2006.01)
(52) U.S. Cl. ........ 713/401; 713/503; 713/600; 711/167; 365/189.07; 365/194; 327/153; 327/292; 327/158
(58) Field of Classification Search .................. 713/401, 713/503, 600; 711/167; 365/189.07, 194; 327/153, 158, 292
See application file for complete search history.

(56) References Cited

U.S. PATENT DOCUMENTS

| | | | |
|---|---|---|---|
| 6,867,627 B1 | 3/2005 | Murtagh | |
| 6,914,798 B2 * | 7/2005 | Kwon et al. | 365/145 |
| 6,986,072 B2 * | 1/2006 | Nishio et al. | 713/401 |
| 7,051,225 B2 * | 5/2006 | Nishio et al. | 713/401 |
| 2002/0181297 A1 * | 12/2002 | Jones et al. | 365/194 |
| 2004/0008064 A1 * | 1/2004 | Kashiwazaki | 327/158 |
| 2005/0289284 A1 * | 12/2005 | Chang | 711/1 |
| 2007/0030938 A1 | 2/2007 | Frank | |
| 2007/0069782 A1 * | 3/2007 | Shin | 327/158 |
| 2007/0139091 A1 | 6/2007 | Frank et al. | |
| 2009/0002040 A1 * | 1/2009 | Oh et al. | 327/158 |

* cited by examiner

*Primary Examiner* — Thuan Du
(74) *Attorney, Agent, or Firm* — Haynes and Boone LLP

(57) ABSTRACT

A memory device is provided. The memory device includes a plurality of memory chips coupled in series, and a register serially coupled to the memory chips. The register includes an integrated delay-locked loop. The memory device may be included in a processing system. Moreover, a method for improving timing budgets in a registered dual in-line memory module (RDIMM) may be implemented using the memory device having a register with an integrated delay-locked loop.

17 Claims, 2 Drawing Sheets

US 8,151,132 B2

MEMORY REGISTER HAVING AN INTEGRATED DELAY-LOCKED LOOP

TECHNICAL FIELD

The present invention is related to memory applications and, in particular, to a register for a memory device, the register having an integrated delay-locked loop.

DISCUSSION OF RELATED ART

Dual In-Line Memory Modules (DIMMs) have become the industry standard for supplying random access memory (RAM) for computer applications. Each DIMM is typically a printed circuit board that includes a number of individual RAM chips. The RAM chips can be any memory chips, for example dynamic RAM (DRAM) chips or synchronous RAM (SRAM) chips. In some cases, the DIMM functions as a double data rate DIMM (DDR DIMM) where data is received both on the rising edge of the clock signal and on the falling edge of the clock signal.

As the demand for memory density increases, DIMM packages that contain a higher density of RAM chips become important. One such DIMM package is a registered DIMM package (RDIMM). An RDIMM package includes one or more registers. The registers typically receive a clock signal and use this to determine a point in time at which to store the input signal level, the input signal including, for example, address bits, which may then be used to drive the output to this level. For example, in an RDIMM, address bits received on the address lines are registered in one or more registers integrated onto the DIMM package before being presented to the RAM chips. The register acts as an electrical buffer, distributing the received memory address bits to each of the RDIMM RAM chips.

However, adding a register to a DIMM package often adds a delay between the clock edge and the output swing, introducing delays and errors into the signals being transmitted to the memory chips. For example, adding a register to a DIMM package may introduce dynamic phase offset and jitter, both of which affect the timing margins of the DIMM, and thus adversely affect performance. To address these errors and delays, a phase-locked loop (PLL) may be used by the register to eliminate the errors and delay. A PLL typically includes a phase comparator, a voltage controlled oscillator, and a feedback path. In operation, a PLL will typically generate a signal that has a fixed relation to the phase of a reference signal by automatically raising or lowering the frequency of the voltage controlled oscillator until it matches the frequency and phase of the reference signal. The PLL will compare the phase of the voltage controlled oscillator with the reference signal to generate an error signal, which is then twice integrated to generate a control signal that is fed back into the voltage controlled oscillator.

Although the PLL is able to eliminate the errors, it also introduces additional delays into the signals, which also affect the performance of the DIMM. The PLL also does not allow for tuning the register to vary the skew of the output signals. Moreover, the voltage-controlled oscillator of the PLL increases power requirements for the DIMM, and introduces additional dynamic phase offset and jitter into the signal.

There is therefore a need to account for the errors introduced by a register in a registered DIMM while still increasing the performance of the DIMM.

SUMMARY

In accordance with aspects of the present invention, there is provided a memory device, comprising a plurality of memory chips coupled in series; and a register serially coupled to the memory chips, wherein the register includes an integrated delay-locked loop.

In accordance with aspects of the present invention, there is also provided a processing system, comprising a processor; and a random access memory device coupled to the processor through a bus, the random access memory device comprising at least one register; and a delay-locked loop integrated in the register.

In accordance with aspects of the present invention, there is further provided a method for improving timing budgets in a registered dual in-line memory module (RDIMM) having a register which receives an input clock signal, the method comprising: providing a delay-locked loop in the register; receiving the input clock signal in the delay-locked loop; outputting an output clock signal from the delay-locked loop; comparing a phase of the output clock signal to a phase of the input clock signal; generating an error signal based on the comparison; integrating the error signal to generate a delay control signal; and delaying the output clock signal by a predetermined amount based on the control signal.

These and other embodiments will be described in further detail below with respect to the following figures.

Figure 1:
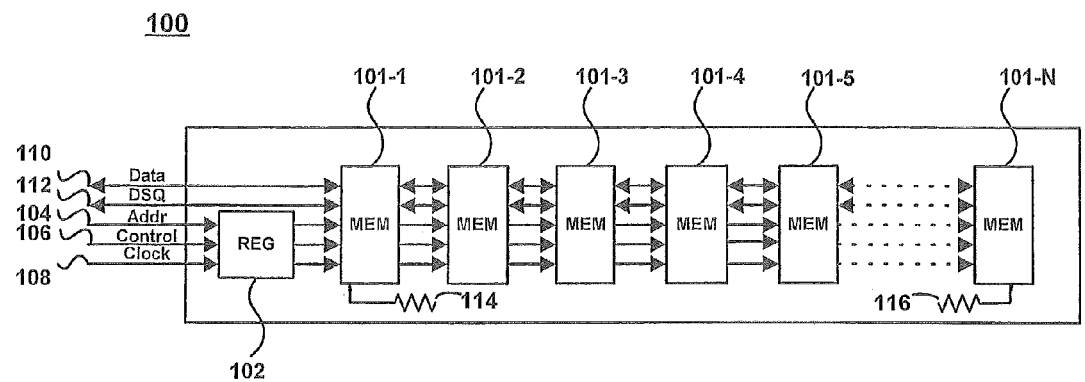
FIG. 1 illustrates an RDIMM package, consistent with the present invention.

In the drawings, elements having the same designation have the same or similar functions.

DETAILED DESCRIPTION

In the following description specific details are set forth describing certain embodiments of the invention. It will be apparent, however, to one skilled in the art that the present invention may be practiced without some or all of these specific details. The specific embodiments presented are meant to be illustrative of the present invention, but not limiting. One skilled in the art may realize other material that, although not specifically described herein, is within the scope and spirit of this disclosure.

FIG. 1 illustrates a memory device 100 consistent with the present invention. In accordance with aspects of the present invention, memory device 100 may be a registered dual in-line memory module (RDIMM) package 100. Consistent with the present invention, RDIMM 100 may be a random access memory device in a processing system including a processor, such as, for example, a computer system.

RDIMM package 100 includes individual memory chips 101-1 through 101-N, coupled in series. Consistent with the present invention, individual memory chips may be random access memory (RAM) chips or dynamic random access memory (DRAM) chips.

As shown in FIG. 1, RDIMM package includes a register 102, which is serially coupled to memory chip 101-1. Consistent with embodiments of the present invention, register 102 may be coupled to any of memory chips 101-1 through 101-N. Register 102 resides in RDIMM package 100, and may drive the inputs of more RAM chips than could otherwise be supported in RDIMM package 100. For example, as shown in FIG. 1, register 102 is coupled to address line 104, control line 106, and clock line 108 to receive an address signal, a control signal, and a clock signal. Register 102 may then drive the address signal and the control signal through memory chips 101-1 through 101-N, and may buffer the clock signal before transmitting the clock signal through memory chips 101-1 through 101-N.

Memory chips 101-1 through 101-N are all coupled to data lines 110 to receive and transmit data, strobe lines 112 to receive and transmit strobe (DSQ/DSQ#) signals, as well as address lines 104 to receive the address signal, and control lines 106 to receive control signals. Memory chips 101-1 through 101-N are also coupled to clock line 108 to receive the clock signal. Consistent with embodiments of the present invention, at least one of memory chips 101-1 through 101-N may be coupled to a resistance, which may be a terminal resistance. In one specific embodiment, a first memory chip 101-1 is coupled to a first terminal resistance 114, and a last memory chip 101-N is coupled to a second terminal resistance 116.

Figure 2:
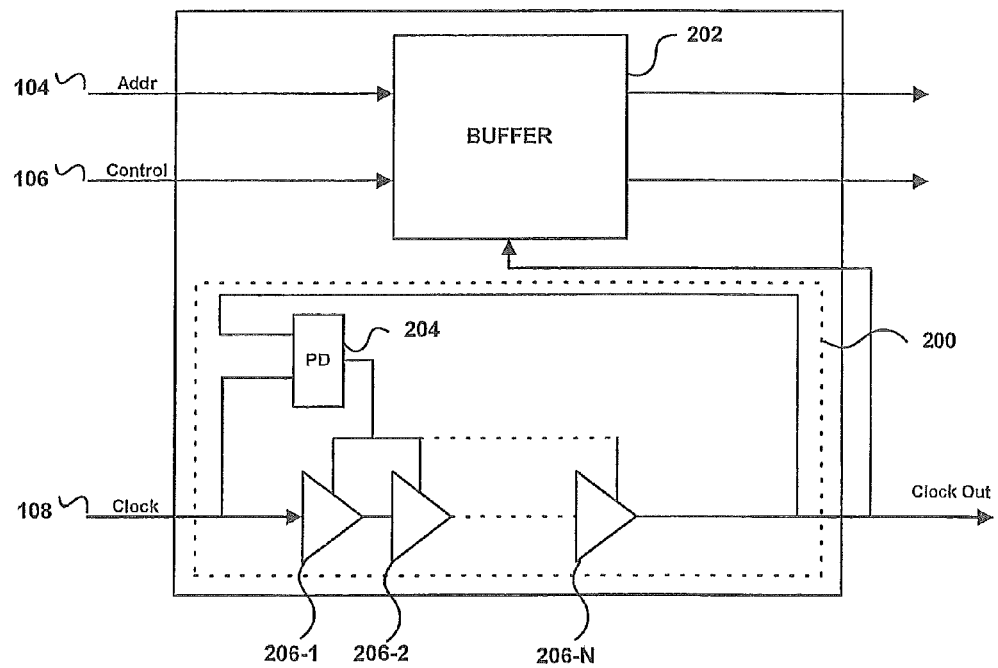
FIG. 2 illustrates register incorporating a delay-locked loop (DLL), consistent with the present invention.

FIG. 2 illustrates register 102 incorporating a delay-locked loop (DLL) 200, consistent with the present invention. As shown in FIG. 2, address lines 104 and control lines 106 are coupled to a buffer 202 which temporarily stores the address and control signals, and then drives the address and control signals through memory chips 101-1 through 101-N. DLL 200 is coupled to clock line 108 and receives and buffers the clock signal by delaying the clock signal by a predetermined amount. DLL 200 includes a phase detector 204 and a plurality of variable delay gates 206-1 through 206-N. As shown in FIG. 2, delay gates 206-1 through 206-N are coupled in series, and phase detector 204 is coupled in parallel with each delay gate 206-1 through 206-N.

Figure 3:
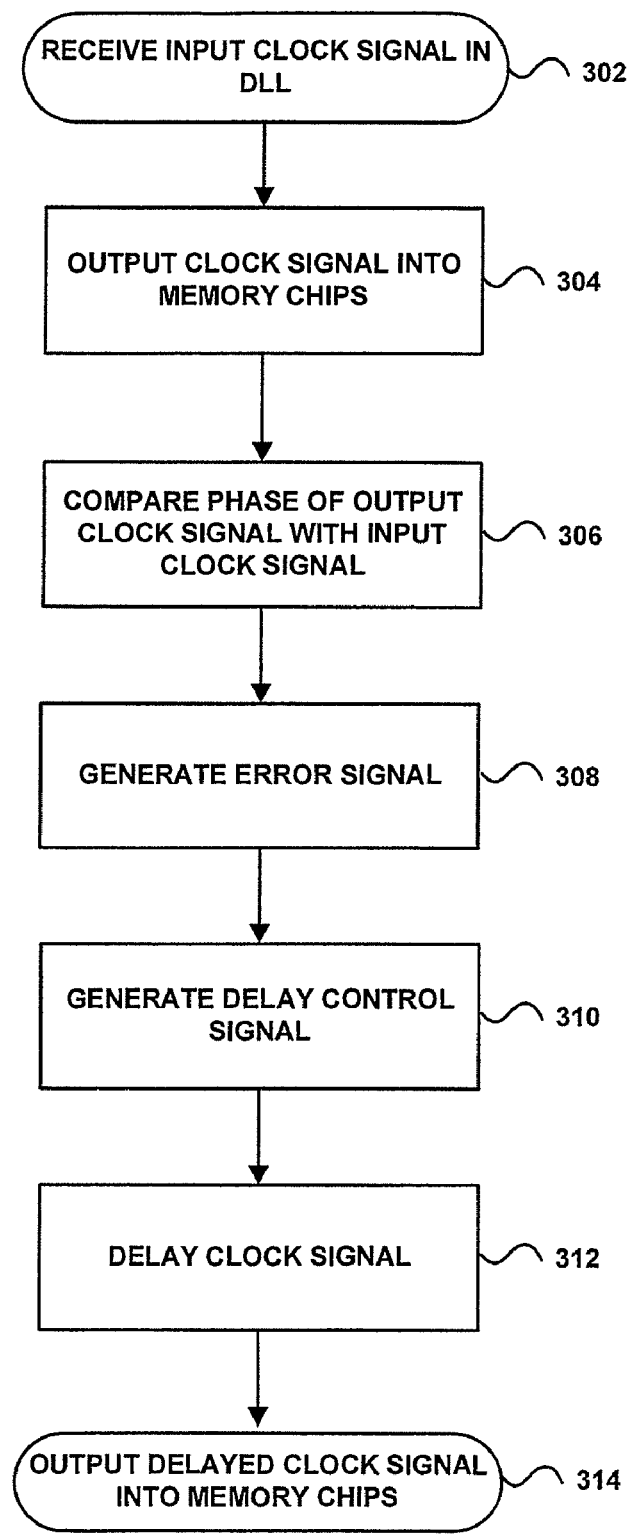
FIG. 3 is a flowchart illustrating a method for delaying a clock signal using a DLL, consistent with the present invention.

The operation of DLL 200 will be explained with reference to FIG. 3. FIG. 3 is a flowchart illustrating a method for delaying a clock signal using a DLL, consistent with the present invention. A clock signal carried on clock line 108 is input into DLL 200, and into delay gates 206-1 through 206-N (step 302). The clock signal is then transmitted through variable delay gates 206-1 through 206-N which delays the clock signal by a predetermined amount. The output clock signal is then output from DLL 200 into buffer 202 and into memory chips 101-1 through 101-N (step 304). Phase detector 204 samples the input clock signal and the output clock signal, and compares the phase of the output clock signal with the input clock signal (step 306). Based on the comparison, phase detector 204 generates an error signal (step 308) which is then integrated in the phase detector to generate a delay control signal (step 310). The delay control signal is input into each variable delay gate 206-1 through 206-N which delays the clock signal by a predetermined amount (step 312). The delayed clock signal is then output from DLL 200 and input into memory chips 101-1 through 101-N (step 314). Consistent with the present invention, the integration forces the error to go to zero, while maintaining a phase lock between the input and output clock signals. By avoiding the internal oscillator of the standard PLL, DLL 200 is able to reduce the errors associated with, for example, dynamic phase offset and jitter, and timings associated with tracking the jitter, while using less power than a PLL-based register and improving timing budgets.

Embodiments consistent with the present invention may improve timing budgets of RDIMM 100 by delaying the clock signal with DLL 200 integrated in register 102 of RDIMM 100. In particular, using a DLL 200 in register 102 of RDIMM 100 may reduce errors in a clock signal, while using less power than a standard PLL. Moreover, register 102 having integrated DLL 200 may be used in memory devices designed to meet the JEDEC DDR3 specification.

For illustrative purposes, embodiments of the invention have been specifically described above. This disclosure is not intended to be limiting. Therefore, the invention is limited only by the following claims.

What is claimed is:

1. A memory device, comprising:
   a plurality of memory chips coupled in series, the first memory chip of the plurality of memory chips being coupled to a first terminal resistance and a last memory chip of the plurality of memory chips being coupled to a second terminal resistance;
   a register serially coupled to the memory chips, the register configured to receive an address signal, a control signal, and at least one clock signal; and
   an integrated delay-locked loop in the register, the integrated delay-locked loop comprising a phase detector, the phase detector configured to:
      receive the at least one clock signal and a delayed clock signal;
      compare a phase of the at least one clock signal to a phase of the delayed clock signal;
      generate an error signal based on the comparison; and
      integrate the error signal to generate a delay control signal and force the error signal to go to zero while maintaining a phase lock between the at least one clock signal and the delayed clock signal.

2. The memory device of claim 1, wherein the register drives the address signal and the control signal through the memory chips, and the register buffers the at least one clock signal.

3. The memory device of claim 1, wherein the delay-locked loop receives the at least one clock signal and outputs the delayed clock signal having a predetermined delay.

4. The memory device of claim 1, wherein the delay-locked loop further comprises:
   a plurality of variable delay gates coupled in series and coupled in parallel to the phase detector, at least one of the plurality of delay gates receiving the at least one clock signal and at least one of the plurality of delay gates outputting the delayed clock signal having a predetermined delay, wherein
   the predetermined delay is controlled by the delay control signal.

5. The memory device of claim 4, wherein the memory device has an associated dynamic phase offset, and the delay-locked loop reduces the timing of the dynamic phase offset.

6. The memory device of claim 1, wherein the memory chips comprise dynamic random access memory (DRAM) chips.

7. The memory device of claim 1, wherein the memory device comprises a registered dual in-line memory module (RDIMM).

8. The memory device of claim 1, wherein the memory device is a double data rate type 3 (DDR3) memory device.

9. A processing system, comprising:
   a processor; and
   a random access memory device coupled to the processor through a bus, the random access memory device comprising:
      a plurality of memory chips coupled in series, the first memory chip of the plurality of memory chips being coupled to a first terminal resistance and a last memory chip of the plurality of memory chips being coupled to a second terminal resistance at least one register coupled to the plurality of memory chips the register configured to receive an address signal, a control signal, and at least one clock signal; and; and a delay-locked loop integrated in the register, the delay-locked loop comprising a phase detector, the phase detector configured to:

receive the at least one clock signal and a delayed clock signal;

compare a phase of the at least one clock signal to a phase of the delayed clock signal;

generate an error signal based on the comparison; and integrate the error signal to generate a delay control signal and force the error signal to go to zero while maintaining a phase lock between the at least one clock signal and the delayed clock signal.

10. The processing system of claim 9, wherein the random access memory device further comprises:

a plurality of memory chips coupled in series, the register being coupled in series to at least one of the memory chips.

11. The processing system of claim 10, wherein the memory chips comprise dynamic random access memory (DRAM) chips.

12. The processing system of claim 9, wherein the at least one register drives the address signal and the control signal through the memory chips, and the register buffers the at least one clock signal.

13. The processing system of claim 9, wherein the delay-locked loop receives the at least one clock signal and outputs the delayed clock signal having a predetermined delay.

14. The processing system of claim 9, wherein the delay-locked loop comprises;

a plurality of variable delay gates coupled in series and coupled in parallel to the phase detector, at least one of the plurality of delay gates receiving the at least one clock signal and at least one of the plurality of delay gates outputs the delayed clock signal having a predetermined delay, wherein the predetermined delay is controlled by the delay control signal.

15. The processing system of claim 14, wherein the random access memory device has an associated dynamic phase offset, and the delay-locked loop reduces the timing of the dynamic phase offset.

16. The processing system of claim 9, wherein the random access memory device comprises a registered dual in-line memory module (RDIMM).

17. A method for improving timing budgets in a registered dual in-line memory module (RDIMM) having a register which receives an input clock signal, the method comprising:

providing a delay-locked loop in the register;

receiving the input clock signal in the delay-locked loop;

outputting an output clock signal from the delay-locked loop;

comparing, in a phase detector of the register, a phase of the output clock signal to a phase of the input clock signal;

generating an error signal based on the comparison;

integrating, in the phase detector, the error signal to generate a delay control signal, wherein integrating the error signal forces the error signal to go to zero while maintaining a phase lock between the input clock signal and the output clock signal; and delaying the output clock signal by a predetermined amount based on the control signal.

* * * * *